United States Patent
Hayashida

(10) Patent No.: US 10,971,532 B2
(45) Date of Patent: Apr. 6, 2021

(54) RADIATION IMAGING APPARATUS, RADIATION IMAGING METHOD, AND STORAGE MEDIUM

(71) Applicant: CANON KABUSHIKI KAISHA, Tokyo (JP)

(72) Inventor: Shinsuke Hayashida, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/658,568

(22) Filed: Oct. 21, 2019

(65) Prior Publication Data

US 2020/0135780 A1 Apr. 30, 2020

(30) Foreign Application Priority Data

Oct. 24, 2018 (JP) .............................. JP2018-200299

(51) Int. Cl.
*H01L 27/146* (2006.01)
*H04N 5/361* (2011.01)
*H04N 5/378* (2011.01)

(52) U.S. Cl.
CPC .. *H01L 27/14612* (2013.01); *H01L 27/14623* (2013.01); *H01L 27/14645* (2013.01); *H04N 5/361* (2013.01); *H04N 5/378* (2013.01)

(58) Field of Classification Search
CPC ......... H01L 27/14612; H01L 27/14645; H01L 27/14623; H04N 5/378; H04N 5/361; H04N 5/32; H04N 5/3658; H04N 5/347; H04N 5/36963; A61B 6/50; A61B 6/44; A61B 6/42
See application file for complete search history.

(56) References Cited

U.S. PATENT DOCUMENTS

| 9,014,461 | B2 | 4/2015 | Hayashida | |
|---|---|---|---|---|
| 10,245,003 | B2 | 4/2019 | Hayashida | |
| 2010/0034356 | A1* | 2/2010 | Hayashida | H04L 67/12 378/98 |
| 2010/0091161 | A1* | 4/2010 | Suzuki | H01L 27/14609 348/302 |
| 2012/0020541 | A1 | 1/2012 | Hayashida | |
| 2014/0014818 | A1* | 1/2014 | Cho | H04N 5/36961 250/208.1 |
| 2014/0347516 | A1* | 11/2014 | Sano | H04N 5/37455 348/230.1 |
| 2015/0194469 | A1* | 7/2015 | Joei | H01L 27/14647 257/40 |
| 2019/0324156 | A1* | 10/2019 | Miura | G01T 7/00 |
| 2020/0244902 | A1* | 7/2020 | Yoshikawa | H04N 5/378 |
| 2020/0292474 | A1* | 9/2020 | Hayashida | G01N 23/046 |

FOREIGN PATENT DOCUMENTS

JP 2007-019820 1/2007

* cited by examiner

*Primary Examiner* — Abdelaaziz Tissire
(74) *Attorney, Agent, or Firm* — Venable LLP

(57) ABSTRACT

A radiation imaging apparatus in which a pixel for obtaining an image based on radiation and a light shielded pixel which is shielded from light are arranged in an array, comprises: a setting unit configured to set a region including a plurality of pixels for obtaining the image based on the radiation and cause pixel values based on the plurality of pixels in the region to be output; and a correction unit configured to determine whether the light shielded pixel is included in the region, and correct the pixel values based on the plurality of pixels in the region if the light shielded pixel is included in the region.

19 Claims, 9 Drawing Sheets

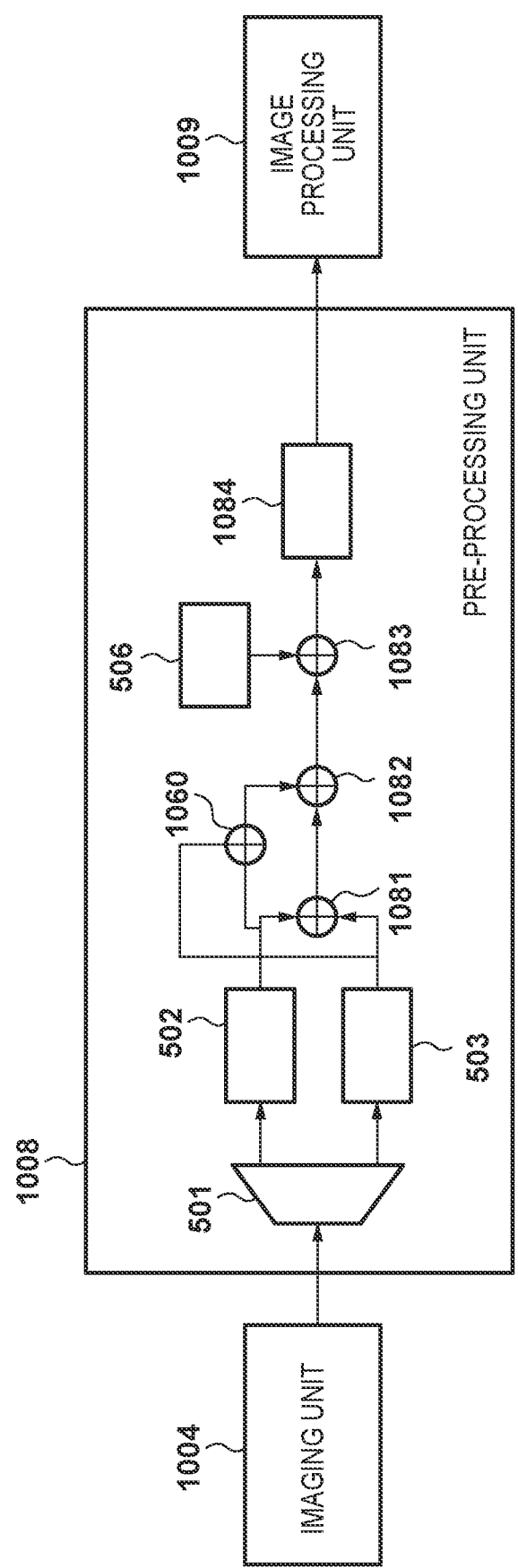

RADIATION IMAGING APPARATUS, RADIATION IMAGING METHOD, AND STORAGE MEDIUM

BACKGROUND OF THE INVENTION

Field of the Invention

The present invention relates to a radiation imaging apparatus, a radiation imaging method, and a storage medium.

Description of the Related Art

In recent years, as a radiation imaging apparatus that is used for medical image diagnosis and non-destructive inspection by radiation, a radiation imaging apparatus that uses a matrix substrate which includes a pixel array formed by combining switches such as TFTs (thin-film transistors) and conversion elements such as photoelectric conversion elements has been put into practice. There is a demand for a more flat and lightweight radiation imaging apparatus, and the amount of heat generating components such as a battery and electronic components and the like incorporated at a high density in the housing of the imaging apparatus is increasing. In addition, there is also a demand for a dual-purpose imaging apparatus for moving image capturing and still image capturing to have a function to allow high-speed moving image capturing to be performed, and such a dual-purpose imaging apparatus is required to have a binning readout function for reading a plurality of pieces of pixel information at once so that a moving image can be stored in a small capacity. Under these various demands, an offset signal that is output from each pixel may change due to differences in imaging conditions and environmental conditions such as the temperature at which the radiation imaging apparatus is used.

Japanese Patent Laid-Open No. 2007-19820 discloses an arrangement in which light shielded pixels for obtaining offset signals are scattered and arranged in an effective pixel region arranged with pixels for generating electronic signals corresponding to radiation, and the outputs from the light shielded pixels are used to suppress the shading of the offset signals.

However, the arrangement disclosed in Japanese Patent Laid-Open No. 2007-19820 requires light shielded pixels that correspond to the binning size to be arranged at the time of a binning readout operation, and the uniformity of the radiation image can degrade because the arrangement of the light shielded pixels will increase the size of a deficient pixel region that has no light sensitivity.

The present invention has been made in consideration of the above problem, and provides a radiation imaging technique that can maintain uniformity of a radiation image even if a light shielded pixel is present.

SUMMARY OF THE INVENTION

According to one aspect of the present invention, there is provided a radiation imaging apparatus in which a pixel for obtaining an image based on radiation and a light shielded pixel which is shielded from light are arranged in an array, comprising: a setting unit configured to set a region including a plurality of pixels for obtaining the image based on the radiation and cause pixel values based on the plurality of pixels in the region to be output; and a correction unit configured to determine whether the light shielded pixel is included in the region, and correct the pixel values based on the plurality of pixels in the region if the light shielded pixel is included in the region.

According to another aspect of the present invention, there is provided a radiation imaging method of a radiation imaging apparatus in which a pixel for obtaining an image based on radiation and a light shielded pixel which is shielded from light are arranged in an array, the method comprising: setting a region including a plurality of pixels for obtaining the image based on the radiation and causing pixel values based on the plurality of pixels in the region to be output; and determining whether the light shielded pixel is included in the region, and correcting the pixel values based on the plurality of pixels in the region if the light shielded pixel is included in the region.

According to the present invention, it is possible to maintain the uniformity of a radiation image even if a light shielded pixel is present.

Further features of the present invention will become apparent from the following description of exemplary embodiments (with reference to the attached drawings).

BRIEF DESCRIPTION OF THE DRAWINGS

FIG. 5 is a view for explaining correction processing performed by a pre-processing unit;

DESCRIPTION OF THE EMBODIMENTS

First Embodiment

Embodiments of the present invention will be described in detail hereinafter with reference to the accompanying drawings. Note that radiation described in the following embodiments includes not only X-rays, but also α-rays, β-rays, γ-rays, and the like that are beams generated by particles (including photons) emitted by radioactive decay, and additionally, beams having equivalent energy or more, and the present invention is applicable to a radiation imaging apparatus that performs radiation imaging of a subject by using other kinds of radiation (for example, α-rays, β-rays, γ-rays, or the like).

(Overall Arrangement of Radiation Imaging Apparatus 1000)

Figure 1:
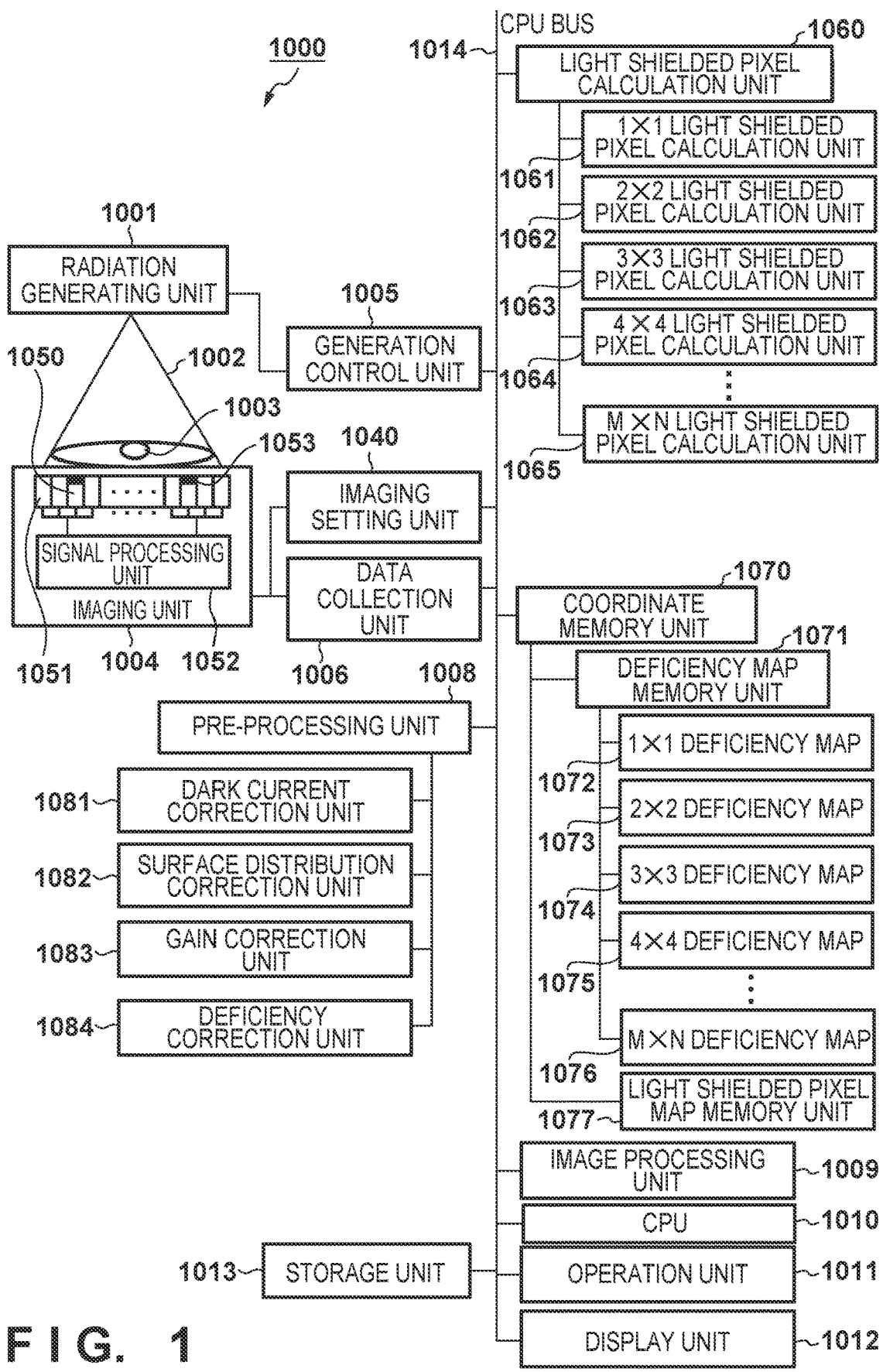
FIG. 1 is a view showing the overall arrangement of a radiation imaging apparatus according to an embodiment.

The first embodiment of the present invention will be described first. FIG. 1 is a view showing the overall arrangement of a radiation imaging apparatus 1000 according to the first embodiment. The radiation imaging apparatus 1000 is used as a medical device, and a medical professional (to be referred to as an "operator" hereinafter) sets imaging conditions via an operation unit 1011. The set imaging conditions are stored in a storage unit 1013, and a CPU 1010 that functions as a control unit of the radiation imaging apparatus 1000 sets the imaging conditions to an imaging unit 1004, which includes a radiation generating unit 1001 and a radiation detection unit, via a CPU bus 1014.

The radiation generating unit 1001 irradiates a subject 1003 with radiation 1002. The subject 1003 is, for example, a human body. The radiation generating unit 1001 includes a generator (a light tube or a radiation tube) that generates radiation and a collimator that defines an angle indicating the spread of the beam of the radiation generated by the generator. A generation control unit 1005 performs control related to radiation generation by the radiation generating unit 1001 under the overall control by the CPU 1010 based on an imaging instruction from the operator. The generation control unit 1005 starts executing the control related to radiation generation when the radiation irradiation switch is pressed.

The radiation imaging apparatus includes a detection unit (a radiation detection unit 450 (FIGS. 4A and 4B)) on which pixels (unshielded pixels 1051) for obtaining an image (radiation image) based on radiation and light shielded pixels 1050 for obtaining offset signals included in the image based on radiation are arranged in an array. The imaging unit 1004 is, for example, an FPD (flat panel detector) and includes the radiation detection unit 450 (FIGS. 4A and 4B) on which a plurality of pixels for detecting radiation and accumulating charges are arranged two-dimensionally. The imaging unit 1004 generates radiation image data and offset signals. The light shielded pixels 1050 and the unshielded pixels 1051 are arranged in an effective pixel region of the radiation detection unit of the imaging unit 1004. In this case, each light shielded pixel 1050 is a pixel that is shielded from light to obtain an offset signal and does not have sensitivity for radiation. Each light shielded pixel 1050 generates, as an offset signal, an electrical signal corresponding to a dark current. In addition, each unshielded pixel 1051 is a pixel that generates an electrical signal corresponding to the incident radiation and generates the electrical signal corresponding to the incident radiation as radiation image data.

(Arrangement of Imaging Unit 1004)

Figure 4A:
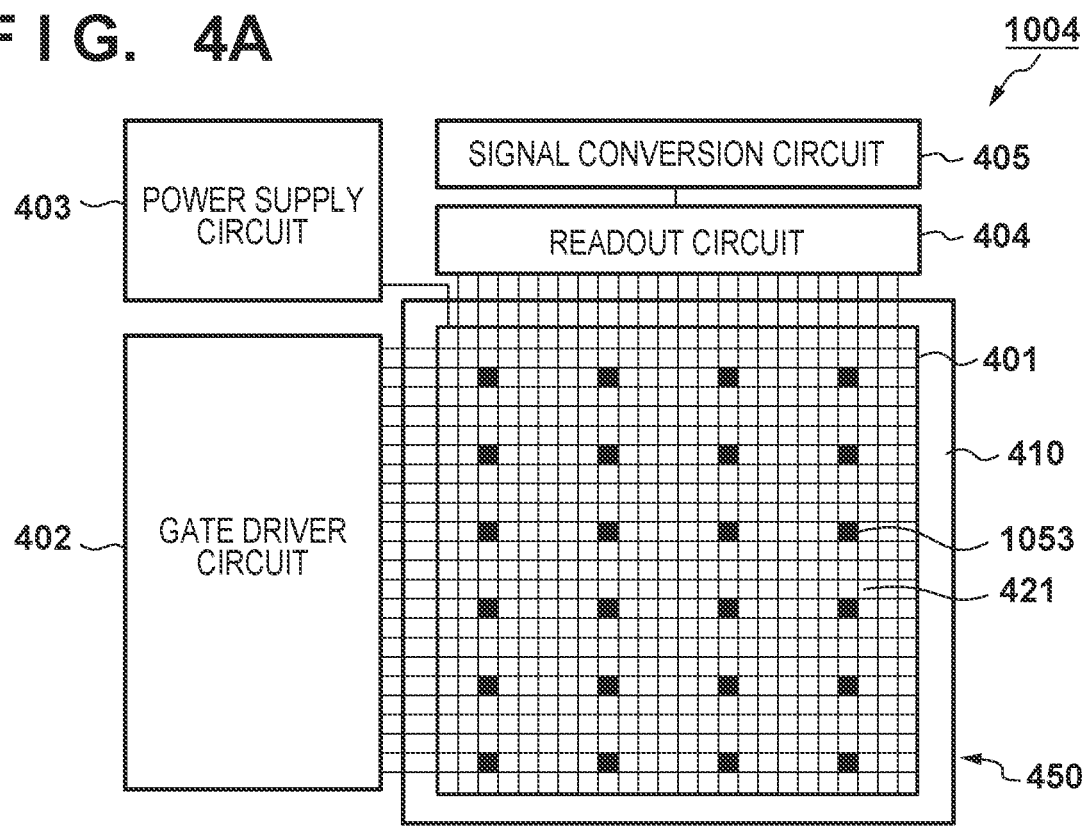
FIGS. 4A and 4B are views for explaining the arrangement of an imaging unit which includes a radiation detection unit.

The arrangement of the imaging unit 1004 will be described next with reference to FIGS. 4A and 4B. The imaging unit 1004 includes the radiation detection unit 450 including an array substrate 410, a gate driver circuit 402, a power supply circuit 403, a readout circuit 404, and a signal conversion circuit 405.

A plurality of pixels that have a two-dimensional arrangement structure are formed in an array on the array substrate 410 of the radiation detection unit 450. A fluorescent material is formed on the upper portion of the array substrate 410. The radiation 1002 that entered the imaging unit 1004 is converted into visible light by the fluorescent material.

Photoelectric conversion elements are distributed and arranged two-dimensionally as the arrangement of pixels (unshielded pixels 1051) that convert radiation into electrical signals in an effective pixel region 401 of the array substrate 410. Visible light is photoelectrically converted into an electrical signal by the photoelectric conversion element of each unshielded pixel 1051 which serves as a normal pixel. The photoelectric conversion elements of the respective unshielded pixel 1051 detect the two-dimensional distribution of the radiation 1002 emitted from the radiation generating unit 1001, and the readout circuit 404 reads out the electrical signals from the unshielded pixels 1051 and outputs the signals to the signal conversion circuit 405. The signal conversion circuit 405 generates radiation image data based on the electrical signals generated by the unshielded pixels 1051.

Light shielded members 1053 are arranged as the arrangement of pixels (light shielded pixels 1050) that do not have sensitivity for radiation 1002 in the effective pixel region 401 of the array substrate 410. Each light shielded member 1053, such as a metal, shields a space between the fluorescent material and the photoelectric conversion element in the light shielded pixel 1050 as well as some parts of adjacent pixels from light, and the light shielded pixel 1050 is shielded from the light by the light shielding member so photoelectric conversion will not be performed even if the radiation 1002 or the visible light hits the light shielded pixel 1050. Each light shielded pixel 1050 detects an offset signal (dark current signal) included in the radiation image data, and the readout circuit 404 reads out the signal from each light shielded pixel 1050 and outputs the signal to the signal conversion circuit 405. The signal conversion circuit 405 generates an offset signal to be used in offset correction based on the signals generated in the light shielded pixels 1050.

Figure 4B:
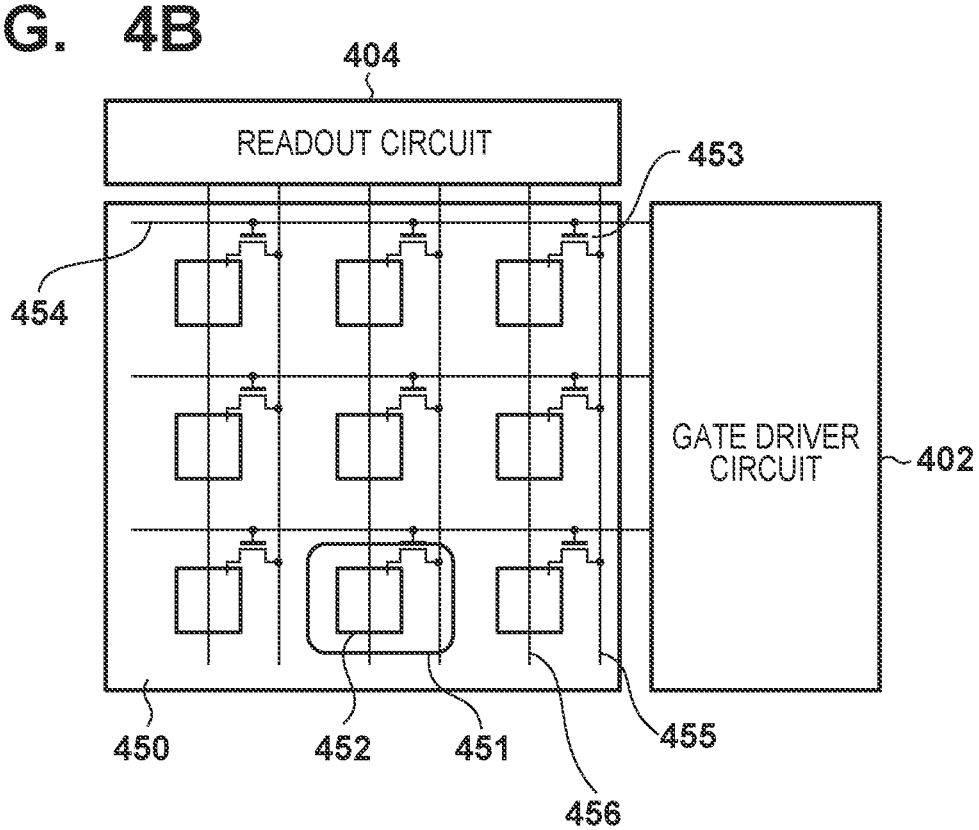

As shown in FIG. 4B, the imaging unit 1004 includes, in the effective pixel region 401, the radiation detection unit 450 on which a plurality of pixels 451 that detect radiation and accumulate charges are two-dimensionally arranged. Each pixel 451 includes a conversion element (photoelectric conversion element) 452 which converts radiation into an electrical signal and a switch element 453 which is arranged between the conversion element 452 and a corresponding one of signal lines 455. Each switch element 453 includes, for example, a thin-film transistor (TFT) in which the active region is formed by a semiconductor made of amorphous silicon or polysilicon (preferably, polysilicon). Among the pixels arranged in the radiation detection unit 450, light shielded pixels 1050, which do not have sensitivity for radiation and are shielded from light by the light shielded member 1053 so photoelectric conversion will not be performed even when they are hit by the radiation 1002 or visible light, are arranged in addition to the unshielded pixels 1051 that output electrical signals corresponding to the incident radiation.

In the radiation detection unit 450, bias lines 456 extend in the column direction and are connected to the electrodes of the plurality of conversion elements 452 arranged in the column direction. Each bias line 456 receives a bias voltage from the power supply circuit 403 of FIG. 4A. Each gate line (driving line) 454 corresponds to one of a plurality of rows of the radiation detection unit 450, and each gate line 454 is driven by the gate driver circuit 402. In addition, each signal line 455 corresponds to one of a plurality of columns of the radiation detection unit 450, and each signal line 455 is driven by the readout circuit 404.

The gate driver circuit 402 selects each gate line 454 of the effective pixel region 401 and transmits, to the readout circuit 404, electrical signals output from the unshielded pixels 1051 and the light shielded pixels 1050 connected to the gate line 454. The readout circuit 404 selects each signal line 455 of the effective pixel region 401 and reads out the electrical signals from the light shielded pixels 1050 and the unshielded pixels 1051 connected to the signal line 455. The electrical signals output from the unshielded pixels 1051 and the light shielded pixels 1050 are analog signals. The readout circuit 404 outputs each input electrical signal to the signal conversion circuit 405, and the signal conversion circuit 405 processes each signal based on the output from the readout circuit 404. The signal conversion circuit 405 includes an analog-digital converter, and the signal conversion circuit 405 converts the analog signal output from the readout circuit 404 into a digital signal.

That is, the signal conversion circuit 405 generates digital-signal radiation image data based on the analog electrical signal generated by each unshielded pixel 1051, and generates a digital offset signal based on the analog electrical signal generated by each light shielded pixel 1050. The signal conversion circuit 405 transmits each of the converted digital signals (radiation image data and offset signals) to a pre-processing unit 1008.

In the pre-processing unit 1008, correction processing is performed on the radiation image data and each offset signal by a dark current correction unit 1081, a surface distribution correction unit 1082, a gain correction unit 1083, and a deficiency correction unit 1084.

(Procedure of Processing of Radiation Imaging Apparatus 1000)

Figure 2:
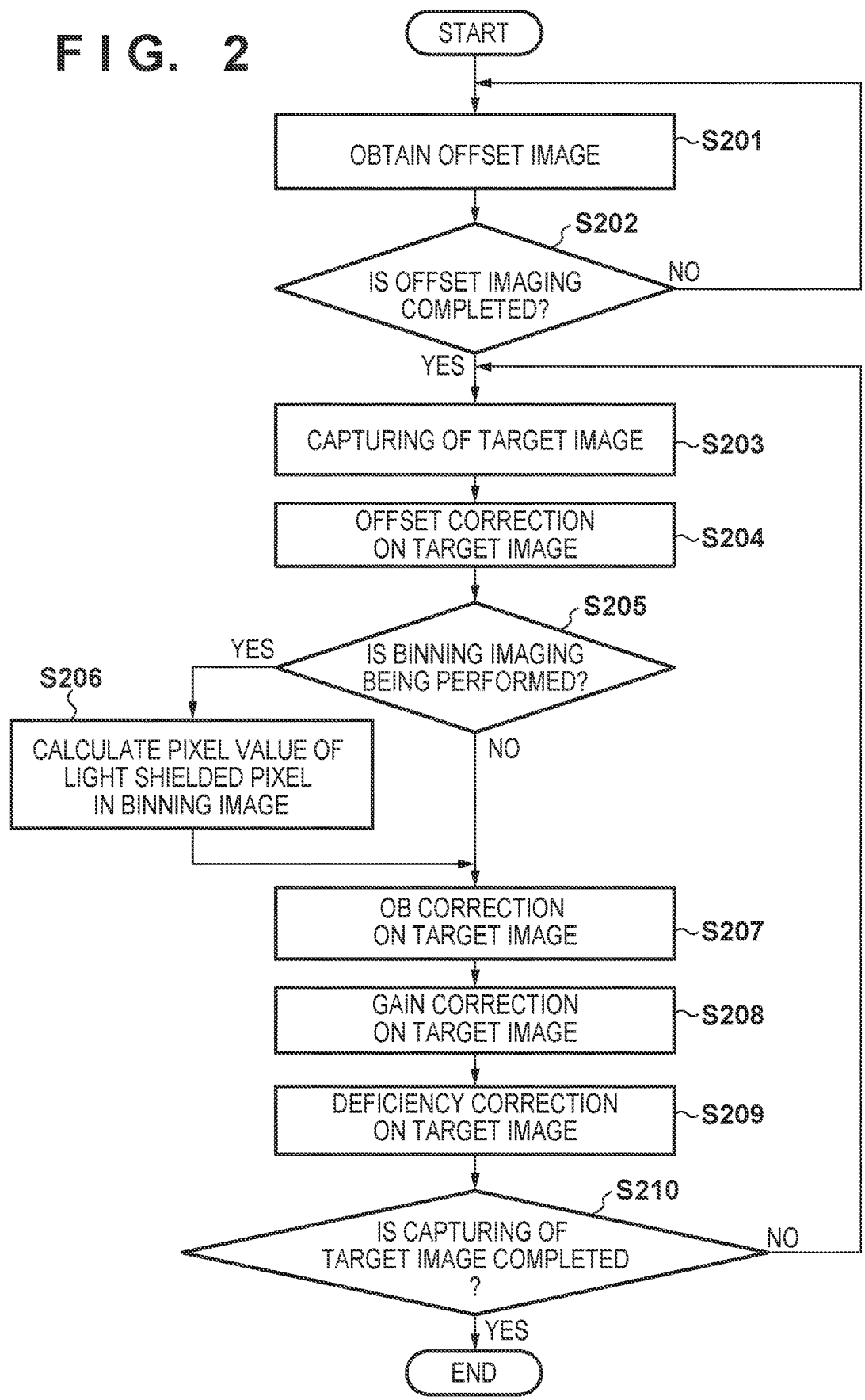
FIG. 2 is a flowchart for explaining the procedure of processing from the start of imaging to the end of imaging according to the first embodiment.

The procedure of processing from the start of imaging to the end of imaging of the subject 1003 by the radiation imaging apparatus 1000 will be described next with reference to FIG. 2. This processing is executed under the overall control of the CPU 1010 of the radiation imaging apparatus 1000.

First, in step S201, the imaging unit 1004 of the radiation imaging apparatus 1000 obtains an offset image (offset signals). Offset image obtainment is executed by transmitting an instruction from the CPU 1010 to the imaging unit 1004. Offset image obtainment is performed until a predetermined number of images are obtained. The offset images obtained in step S201 are stored in the storage unit 1013.

In step S202, the CPU determines whether the obtainment of a predetermined number of offset images has been completed. Each obtained offset image undergoes image processing (for example, an averaging process) in an image processing unit 1009. The image processing unit 1009 performs image processing such as the averaging process or the like so that the processing will be completed before the start of the image capturing operation (step S203) of a target image. The CPU 1010 controls the display of a display unit 1012 during a period until the image processing of offset image data is completed. For example, the CPU 1010 performs display control so an operation by the operator will not be permitted by causing the display unit 1012 to display a message such as "activating" or the like.

Also, while "activating", the CPU 1010 transmits instructions to the storage unit 1013 and a coordinate memory unit 1070 to load the gain correction data to be used for gain correction, each deficiency correction map (a 1×1 deficiency map 1072 to an M×N deficiency map 1076 and the like) to be used to calculate the pixel value of each shielded pixel during binning imaging, and a light-shielded pixel map indicating the position of each light shielded pixel 1050 on the radiation detection unit 450.

In this case, the gain correction data is image data obtained by performing radiation irradiation and imaging in a state without the subject 1003 under imaging conditions identical to those of the radiation image data which is to be the gain correction target. The obtained gain correction data is stored in the storage unit 1013. In addition, each of deficiency maps 1072 to 1075 is information indicating the position of each light shielded pixel 1050 in a binning image of a set binning size such as 1×1, 2×2, . . . 4×4, or the like.

Based on the instruction from the CPU 1010, the gain correction data, each deficiency map, and the light shielded pixel map are loaded from the storage unit 1013 and the coordinate memory unit 1070 to the pre-processing unit 1008 and a light shielded pixel calculation unit 1060 of the radiation imaging apparatus 1000.

When the gain correction data, each deficiency map, and the light shielded pixel map have been loaded, the gain correction unit 1083 and the deficiency correction unit 1084 can perform gain correction and deficiency correction, respectively, based on the gain correction data and the deficiency map. In a case in which binning imaging is performed, the positions of the light shielded pixels in each binning image can be specified, and the pixel value of each light shielded pixel in the binning image can be calculated.

Offset image obtainment is executed until the obtainment of the predetermined number of offset images is completed (NO in step S202, step S201), and the process advances to step S203 when the obtainment of the predetermined number of offset images ends (YES in step S202).

In step S203, an image capturing operation of a target image (a radiation image in which the subject 1003 is present) can be performed, and the image capturing operation of the target image is started by an operation performed by the operator.

In step S204, the dark current correction unit 1081 performs offset correction as the correction processing of the captured target image. As a method of offset correction, the dark current correction unit 1081 performs, before the image capturing operation for obtaining the radiation image of the subject, offset correction processing by setting the offset image obtained in a state without radiation irradiation as the correction image and subtracting the offset image from the radiation image (radiation image data) of the subject.

In step S205, the CPU 1010 determines whether binning imaging is being performed. If the binning imaging is not being performed (NO in step S205), the process advances to step S207. On the other hand, if binning imaging is being performed (YES in step S205), the CPU 1010 advances the process to step S206.

In step S206, based on the binning setting indicating the size of the binning image and the position information of each light shielded pixel stored in a light shielded pixel map memory unit 1077, the light shielded pixel calculation unit 1060 determines whether a light shielded pixel is included in the binning image. If a light shielded pixel is included in the binning image, the light shielded pixel calculation unit 1060 calculates the value of the light shielded pixel 1050 in the binning image.

The light shielded pixel calculation unit 1060 obtains the position information of each light shielded pixel 1050 arranged in the effective pixel region 401 of the radiation detection unit 450 from the binning setting set via the operation unit 1011 and the light shielded pixel map memory unit 1077 of the coordinate memory unit 1070. Then, the light shielded pixel calculation unit 1060 determines, based on the binning setting and the position information of the light shielded pixel 1050, whether the light shielded pixel is included in the binning image. If the light shielded pixel is included in the binning image, the light shielded pixel calculation unit 1060 performs processing to calculate the pixel value of the light shielded pixel in the binning image and causes the process to advance to step S207 after the calculation processing.

The light shielded pixel calculation unit 1060 includes a plurality of light shielded pixel calculation units 1061 to 1065 that perform calculation processing corresponding to the size of the binning image. The light shielded pixel calculation unit 1060 specifies the light shielded pixel calculation unit that is to perform the calculation processing corresponding to the size of the binning image based on the binning setting.

In the calculation processing by the light shielded pixel calculation unit 1060, the light shielded pixel calculation unit 1060 specifies the corresponding arithmetic operation unit based on the binning setting. If the binning size set in the binning setting is M×N (M and N are integers), the light shielded pixel calculation unit 1060 can set the M×N light shielded pixel calculation unit as the pixel value calculation processing unit of each light shielded pixel. For example, in a case in which the binning size set in the binning setting is 3×3, the light shielded pixel calculation unit 1060 sets the 3×'light shielded pixel calculation unit 1063 as the pixel value calculation processing unit of each light shielded pixel.

Based on the pixel value of a binning image which includes the light shielded pixel 1050 and the pixel values of pixels of peripheral binning images which do not include the light shielded pixel 1050, the light shielded pixel calculation unit 1060 obtains the offset signal of the light shielded pixel 1050 after the execution of binning imaging according to the set binning size.

Note that the light shielded pixel calculation unit 1060 can obtain a calculation processing result corresponding to the predetermined binning size setting by adding or averaging the calculation results of the 1×1 light shielded pixel calculation unit 1061 that performs calculation processing corresponding to a 1×1 binning setting for a predetermined row count direction or a predetermined column count direction. Details of the calculation processing performed by the light shielded pixel calculation unit 1060 will be described later with reference to FIGS. 3A to 3C.

In step S207, the surface distribution correction unit 1082 corrects each pixel value based on the plurality of pixels in accordance with the number of light shielded pixels in the target image (the region specified by the binning setting if binning imaging is being performed). For example, if N (N is an integer) light shielded pixels 1050 are included in the region specified by the binning setting, the surface distribution correction unit 1082 corrects (performs OB correction of) the pixel value of each light shielded pixel 1050 so that the pixel values of the light shielded pixel 1050 corresponding to N pixels will be uniform on the surface. The surface distribution correction unit 1082 corrects the pixel value of each unshielded pixel 1051 based on the correction result of pixel values of the light shielded pixels 1050. After correcting the pixel values of the unshielded pixels 1051 based on the pixel values of the light shielded pixel 1050 after the OB correction, the surface distribution correction unit 1082 advances the process to step S208.

In step S208, the gain correction unit 1083 performs gain correction on the target image. After the gain correction unit 1083 has executed gain correction, the deficiency correction unit 1084 executes, in step S209, deficiency correction on the target image. Note that the offset correction in step S204, the gain correction in step S208, and the deficiency correction in step S209 can be performed by using known correction methods.

Next, in step S210, the CPU 1010 determines whether the image capturing operation of the target image has been fully completed. If the image capturing operation of the target image has not been fully completed (NO in step S210), the CPU 1010 returns the process to step S203 and controls the operation of the radiation imaging apparatus 1000 so that similar processing will be repetitively executed until the image capturing operation of the target image is fully completed (YES in step S210). The CPU 1010 confirms the state of the operation unit 1011 to determine whether the radiation irradiation operation is to be continued. If the image capturing operation is to be ended, the CPU 1010 performs control to simultaneously end the radiation irradiation operation performed by the radiation generating unit 1001. Instead of confirming the operation unit 1011, the CPU 1010 can also determine whether to continue the image capturing operation based on the imaging instruction stored in the storage unit 1013 in advance.

(Processing Performed at Execution of Binning Imaging)

The light shielded pixel calculation unit 1060 includes, as the arithmetic operation units for executing different calculation methods for each binning size, the 1×1 light shielded pixel calculation unit 1061, the 2×2 light shielded pixel calculation unit 1062, the 3×'light shielded pixel calculation unit 1063, the 4×4 light shielded pixel calculation unit 1064 . . . , and uses each light shielded pixel calculation unit to calculate the pixel value of each light shielded pixel in each binning image capturing operation. The light shielded pixel calculation unit 1060 uses a deficiency map memory unit 1071 or the light shielded pixel map memory unit 1077 to calculate the pixel value of each light shielded pixel at the time of binning imaging by the method to be described later with reference to FIGS. 3A to 3C.

The binning setting made through the operation unit 1011 is transmitted to the imaging unit 1004 via an imaging setting unit 1040. The imaging setting unit 1040 sets, based on the binning setting, a region including a plurality of pixels for obtaining an image based on radiation, and outputs pixel values based on the plurality of pixels of the set region. The binning setting is also transmitted to the light shielded pixel calculation unit 1060. This binning setting includes information of the number of pixels in the row direction and the number of pixels in the column direction in the array substrate 410 of the radiation detection unit 450. The size of the binning image can be specified based on the information of the number of pixels in the row direction and the number of pixels in the column direction.

The light shielded pixel calculation unit 1060 includes the 1×1 light shielded pixel calculation unit 1061, the 2×2 light shielded pixel calculation unit 1062, the 3×'light shielded pixel calculation unit 1063, the 4×4 light shielded pixel calculation unit 1064 . . . the M×N light shielded pixel calculation unit (M and N are integers), and the light shielded pixel calculation unit 1060 specifies the corresponding calculation unit based on the binning setting. Note that in a case in which a corresponding calculation unit is not present, the light shielded pixel calculation unit 1060 may obtain, for example, the calculation result corresponding to an arbitrary binning size setting by adding or averaging the calculation processing results of the 1×1 light shielded pixel calculation unit 1061 in a predetermined row count direction or in a predetermined column count direction.

A signal processing unit 1052 included in the imaging unit 1004 controls processing performed on signals output from the pixels (unshielded pixels 1051) or the light shielded pixels 1050 based on the set imaging condition. In the image capturing operation of the target image, the signal processing unit 1052 controls the gate driver circuit 402, the readout circuit 404, and the signal conversion circuit 405 to perform addition of pixel values or averaging of pixel values. When binning imaging is to be performed, the signal processing unit 1052 can control the gate driver circuit 402, the readout circuit 404, and the signal conversion circuit 405 to perform adding or averaging of the binning readout target pixel values based on the binning setting.

Under the control of the signal processing unit 1052, the gate driver circuit 402 is driven, a signal is read out from each pixel by the readout circuit 404, and each electrical signal read out by the readout circuit 404 is input to the signal conversion circuit 405. Each electrical signal is amplified in the signal conversion circuit 405 and becomes an image signal that has been converted from an analog signal into a digital signal. Each converted image signal is transmitted to a data collection unit 1006.

The light shielded pixel calculation unit 1060 and the surface distribution correction unit 1082 function as correction units that correct the pixel values of the plurality of pixels in the region specified by the binning setting. These correction units determine whether the light shielded pixels 1050 are included in the region specified by the binning setting. If the light shielded pixels 1050 are included in the region specified by the binning setting, the correction units correct the pixel values based on the plurality of pixels in the region specified by the binning setting. The light shielded pixel calculation unit 1060 calculates the pixel value of each light shielded pixel 1050 in the radiation image based on the signal processed by the signal processing unit 1052. The surface distribution correction unit 1082 corrects the offset signals of the light shielded pixels 1050 so that the pixel values of the region specified by the binning setting and including the light shielded pixels 1050 will be uniform on the surface of the radiation detection unit 450. That is, the surface distribution correction unit 1082 corrects the pixel value of each light shielded pixel 1050 so that the pixel values of the light shielded pixels will be uniform on the surface in accordance with the number of light shielded pixels in the region specified by the binning setting. The surface distribution correction unit 1082 corrects the value of each unshielded pixel 1051 based on the value of each light shielded pixel 1050 after the correction. That is, the surface distribution correction unit 1082 corrects, based on the corrected offset signal values of the light shielded pixels 1050, the pixel values of the plurality of pixels (unshielded pixel 1051) in a region specified by the binning setting on the surface of the radiation detection unit 450 (FIGS. 4A and 4B).

In a case in which binning imaging in which a plurality of pixels are set as one aggregate and a pixel signal of the aggregate is output has been set as the imaging condition, the imaging setting unit 1040 sets a region including a plurality of pixels for obtaining an image based on radiation and causes the imaging unit 1004 to output a pixel value based on the plurality of pixels in this region to generate a binning image. The light shielded pixel calculation unit 1060 calculates the value of each light shielded pixel 1050 in the binning image, which has been obtained by binning imaging, based on the signal processed by the signal processing unit 1052.

In a case in which the binning setting has been made through the operation unit 1011, image signals converted by the signal conversion circuit 405 are transmitted as a binning image to the data collection unit 1006. The binning image is an image generated based on the binning setting and is an image formed by a plurality of pixels arranged in the row direction and the column direction set in the pixel array.

The data collection unit 1006 inputs the binning image (the radiation image when rearranged) collected from the signal conversion circuit 405 to the pre-processing unit 1008. The pre-processing unit 1008 includes the dark current correction unit 1081 for removing offset signals (dark current signals) from the radiation image data, the surface distribution correction unit 1082 for correcting the dark current signals on the surface of the effective pixel region 401, the gain correction unit 1083 for correcting each pixel value with respect to the radiation dose from the radiation irradiation, and the deficiency correction unit 1084 for performing deficiency correction on each pixel determined to be deficient.

After undergoing various kinds of correction processing in the dark current correction unit 1081, the surface distribution correction unit 1082, the gain correction unit 1083, and the deficiency correction unit 1084, the binning image input to the pre-processing unit 1008 is input to the image processing unit 1009.

The image processing unit 1009 executes image processing (QA processing) for image display. Image processing for image display includes, for example, noise suppression processing, frequency processing such as emphasis processing, gradation processing for generating gradation suitable for diagnosis, and the like. Ultimately, the image obtained after the image processing by image processing unit 1009 will be the image to be used in the diagnosis, and the CPU 1010 performs display control to cause the display unit 1012 to display the processed image.

Note that even if the arrangement of the light shielded pixel calculation unit 1060 is not included in an information processing unit such as a personal computer (PC) outside the imaging unit 1004 in the radiation imaging apparatus 1000, it may be included in an FPGA (Field Programmable Gate Array) in the imaging unit 1004. Also, in this embodiment, although addition readout or averaging readout of electrical signal values (pixel values) output from the pixels performed by using all of the pixels (for example, 9 pixels in a case in which 3x'pixels have been set in the binning setting) specified in the set binning setting is described as the embodiment, a thinning readout operation which does not use all of the pixels of the binning image based on the binning setting may be performed. For example, the present invention can also be applied to the thinning readout operation that uses a pixel which is a part of the binning image, for example, one pixel at the center of N×N pixels (N is an integer) or one arbitrary pixel among the N×N pixels.

Figure 3A:
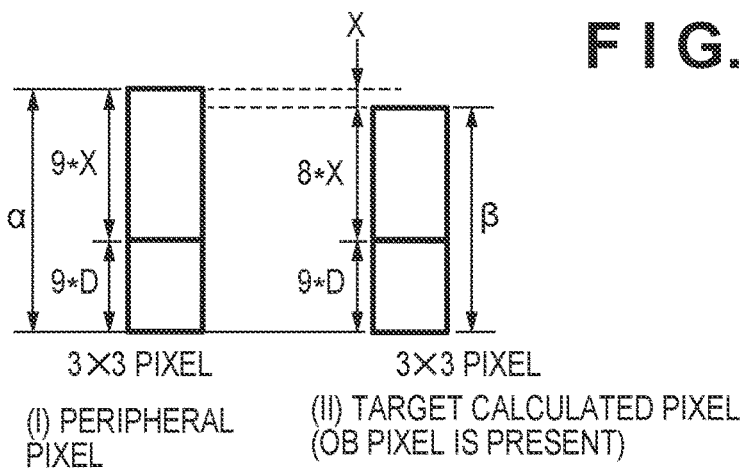
FIGS. 3A to 3C are views for explaining processing performed by a light shielded pixel calculation unit at the time of a binning readout operation.
Figure 3B:
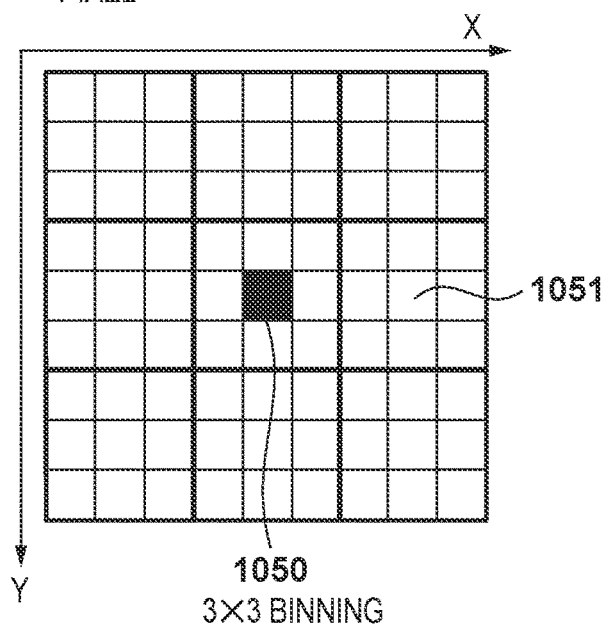
Figure 3C:
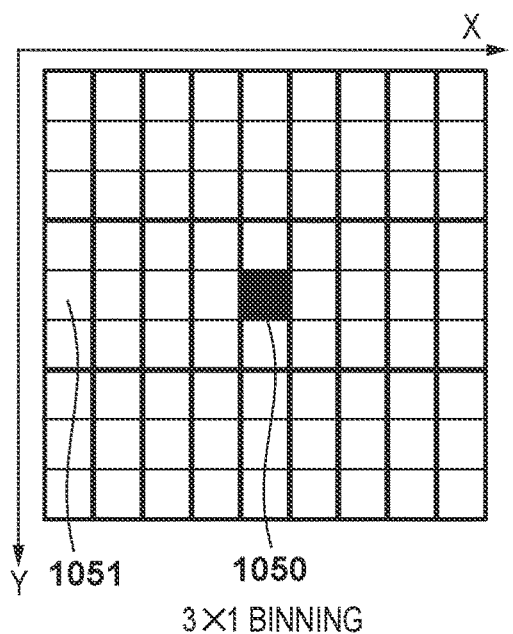

FIGS. 3A to 3C are views for explaining the processing performed by the light shielded pixel calculation unit at the time of binning readout that is applicable to this embodiment. FIG. 3A is a view for explaining the calculation method of the light shielded pixel calculation unit 1060. FIG. 3A is a view exemplifying the light shielded pixel calculation method performed in the case of a 3x'binning readout. FIGS. 3B and 3C are views exemplifying the concept of the pixels and the output values at the time of binning to supplement the explanation of the light shielded pixel calculation method. In this embodiment, the imaging setting unit 1040 sets a plurality of regions on the surface of the radiation detection unit 450 that detects radiation and outputs pixel values based on the plurality of pixels for each of the plurality of regions. In this case, FIG. 3B shows an example of the 3x'binning readout, and FIG. 3C shows an example of a 3×1 binning readout. In a case in which the light shielded pixel 1050 is included in a region specified by the binning setting, the surface distribution correction unit 1082 amplifies the pixel values of the plurality of pixels in accordance with the number of the plurality of pixels and the light shielded pixels in the region.

First, the output of the imaging unit 1004 will be described with reference to FIGS. 3B and 3C. In the imaging unit 1004, the photoelectric conversion elements for generating image signals are arranged in the unshielded pixels 1051 and the light shielded pixel 1050. A plurality of pixels are arranged in a two-dimensional matrix (array). The light shielded pixel 1050 is masked by a metal or the like to prevent light from entering the photoelectric conversion element. When a still image is to be captured, the gate driver circuit 402 is driven under the instruction of the signal processing unit 1052 in the imaging unit 1004, a signal is read out from each pixel by the readout circuit 404, and each electrical signal read out by the readout circuit 404 is input to the signal conversion circuit 405. Each electrical signal is amplified by the signal conversion circuit 405 and converted from an analog signal to a digital signal to become an image signal. The converted image signal is generated as radiation image data that represents the distribution of radiation irradiation as an image of a matrix.

On the other hand, in the light shielded pixel 1050 will output only an offset signal (dark current signal) because the output value does not include the radiation component obtained by photoelectric conversion accompanying radiation irradiation. Since the imaging unit 1004 is arranged in a state in which heat-generating components, for example, power supply system members such as an electronic board, a battery, and the like, are densely packed together due to a flat arrangement and weight reduction, it can generate differences in the distribution of temperature on the surface of the array substrate 410 where the pixels are arranged. An output image (dark current image) based on the dark current signal of the imaging unit 1004 can be an image which has differences in the distribution of dark current signals on the surface of the array substrate 410. In order to output a good image which is uniform on the surface of the array substrate 410, correction is performed to make the distribution of the offset signals (dark current signals) on the surface of the array substrate 410 uniform in this embodiment.

In a moving image/still image dual-purpose radiation imaging apparatus that is capable of capturing not only a still image but also a moving image, the radiation imaging is arranged to have a binning readout function to support a function that allows high-speed moving image capturing and long-hour moving image capturing to be performed. For example, in the binning of 3×'pixels (3×3 binning) shown in FIG. 3B, the added value or the average value of the total of 9 pixels of a 3×'pixel matrix (columns×rows) will be processed as the output of one pixel.

In a case in which the light shielded pixel 1050 is arranged in the 3×'binning image, the pixel value of the binning image will be a calculated value obtained by adding or averaging the pixel values based on the output of the electrical signals converted from radiation that reached 8 unshielded pixels and the offset signals (dark current signals) of 9 pixels. The pixel value of each peripheral binning image, which is a binning image which does not include the light shielded pixel 1050 and is arranged at the periphery of the binning image which includes the light shielded pixel, is obtained by adding or averaging the pixel values based on the output of the electrical signals based on radiation that reached 9 unshielded pixels and the offset signals (dark current signals) of 9 pixels.

Each output pixel value of the imaging unit 1004 undergoes gain correction by the gain correction unit 1083 to correct the gain variation for each pixel. Since the gain correction data used for gain correction stores a gain map corresponding to the radiation dose of each pixel, correction can be performed to a degree in which differences will not visually stand out in the gain corrected image although subtle differences in graininess and the like will remain. However, binning (2×2, 3×3, 4×4, and the like) imaging cannot be used to obtain the surface distribution of dark current signals due to a difference in the environment such as the difference in the temperature of the arrangement position of each pixel.

In this embodiment, the pixel value of each light shielded pixel is obtained, and the pixel value of each unshielded pixel is corrected based on the obtained pixel value of the light shielded pixel. The calculation processing performed by the light shielded pixel calculation unit 1060 that calculates the pixel value of the light shielded pixel will be described hereinafter.

FIG. 3A is a view for explaining the calculation method of the light shielded pixel calculation unit 1060. In this embodiment, a dark current output component needs to be estimated from the output value of each pixel irradiated with radiation (the output value of an electrical signal derived from radiation). Hence, the offset signal (dark current signal) is estimated by paying attention to the output value before the gain correction. In FIG. 3A, (I) a pixel value α of a peripheral binning image which does not include a light shielded pixel can be obtained by 9*X+9*D. In this case, "X" is the radiation contribution component (electrical signal component based on radiation) of the pixel value of a 1×1 binning image, and "D" is a non-radiation contribution component (electrical signal component based on a dark current signal) not including the influence of radiation of the pixel value of the 1×1 binning image.

The pixel value of the peripheral binning image, which does not include the light shielded pixel 1050 and is arranged at the periphery of the binning image (3×3 pixels) which includes the light shielded pixel, is obtained as a value calculated by adding the values of X and values of D of the 9 pixels of the 3×'binning image.

On the other hand, (II) in a set binning size, a pixel value β of a binning image which includes the light shielded pixel 1050 can be obtained by 8*X+9*D. In a case in which the light shielded pixel 1050 is included in the binning image, the pixel value becomes lower than that of the peripheral binning image because the pixel value of the binning image including the light shielded pixel 1050 is output based on "X" (electrical signal components based on radiation) of 8 pixels irradiated with radiation and "D" (electrical signal components based on the dark current signals) of 9 pixels.

When gain correction is performed, the gain component of the output value of the image of each pixel is corrected and becomes almost equal to the pixel value α obtained in (I) and the pixel value β obtained in (II). However, since components generated due to differences in the environment, such as temperature, of a position where each pixel is arranged cannot be corrected in gain correction, differences are generated in the distribution of the dark current signal in the vicinity of the heat generating members. The pixel value of each binning image obtained before the gain correction is used in the first embodiment. The pixel value of each binning image is as follows.

A pixel value of each peripheral binning image $$\alpha = 9*X + 9*D \tag{1}$$

A pixel value of the binning image including the light shielded pixel $$\beta = 8*X + 9*D \tag{2}$$

When the pixel values of respective binning images are obtained by equations (1) and (2), the pixel values α and β can be used to obtain a post-binning imaging pixel value Z by $$Z = 9*D = \beta - 8*X \qquad (3)$$
$$= \beta - 8*(\alpha - \beta)$$
$$= -8*\alpha + 9*\beta$$

The light shielded pixel calculation unit 1060 specifies a light shielded pixel calculation unit corresponding to each set binning size based on the binning setting, and each specified light shielded pixel calculation unit (1060 to 1065) can perform the calculation processing to obtain the pixel value Z described above. The pixel value Z can be used to obtain the pixel value of the light shielded pixel 1050.

The surface distribution correction unit 1082 corrects, as the correction processing of a captured target image (a binning image in the case of binning imaging), the pixel values of the plurality of pixels in the region specified by the binning setting. In a case in which the light shielded pixel 1050 is included in the region specified by the binning setting, the surface distribution correction unit 1082 corrects the pixel value of the light shielded pixel 1050 so that the pixel value of each light shielded pixel 1050 will be uniform on the surface. The surface distribution correction unit 1082 then corrects the pixel value of each unshielded pixel based on the correction result of the pixel value of the light shielded pixel. The surface distribution correction unit 1082 corrects the pixel value of each unshielded pixel based on the pixel value of the light shielded pixel after the OB correction.

In deficiency correction, if binning is to be performed by binning a plurality of pixels (for example, a 2×2 pixel matrix (columns×rows)) into a single pixel, a deficient pixel will be detected in the binned pixel which is a pixel that has undergone the binning processing, and a deficiency map including the information of the deficient pixel will be held for each binning size.

In this embodiment, the deficiency map memory unit 1071 includes, as the deficiency map including the information of the deficient pixel for each binning size, the 1×1 deficiency map 1072, the 2×2 deficiency map 1073, the 3×3 deficiency map 1074, the 4×4 deficiency map 1075 . . . M×N deficiency map 1076 (M and N are integers).

In a case in which deficiency correction is to be performed, the correction target image will be corrected based on a deficiency map by using a deficiency map which has the same binning size as the image that has undergone the binning readout. For example, in a case in which binning readout of a 2×2 pixel matrix (columns×rows) is performed, correction will be performed based on a deficiency map for the 2×2 pixel matrix (columns×rows). In a similar manner, in a case in which binning readout of a 4×4 pixel matrix (columns×rows) is performed, correction will be performed based on a deficiency map for the 4×4 pixel matrix (columns×rows).

Although this embodiment described an example of binning executed on a 3×'pixel matrix (columns×rows) in FIGS. 3A to 3C, similar processing can be performed when binning a 2×2 pixel matrix (columns×rows) and when binning a 4×4 pixel matrix (columns×rows). Furthermore, similar processing can be also performed when binning an image that has a binning size such as 2×1, 3×1, or 4×1.

In addition, the signal processing unit 1052 can control the binning size for pixel addition by switching the signal of an internal analog circuit to high level or low level. This function is called analog binning function since binning is performed in an analog manner. Also, the readout image may be digitally averaged in the FPGA included in the imaging unit 1004. For example, averaging of a 2×2 pixel region or averaging of a 4×4 pixel region can be performed as the ranges of averaging. This function is called a digital binning function. The signal processing unit 1052 can combine analog binning function and the digital binning function.

Based on the pixel value α of each peripheral binning image not including the light shielded pixel 1050 and the pixel value β of a binning image including the light shielded pixel 1050, each light shielded pixel calculation unit (1060 to 1065) can obtain the pixel value of the light shielded pixel after the execution of binning imaging according to the set binning size. The pixel value of the light shielded pixel is the offset signal (dark current signal) output from the light shielded pixel 1050. Based on the pixel value α of each peripheral binning image not including the light shielded pixel 1050 and the pixel value β of the binning image including the light shielded pixel 1050, the surface distribution correction unit 1082 corrects the offset signal of the light shielded pixel after the execution of binning imaging according to the binning size of the set region. That is, correction is performed to make the pixel value α and the pixel value β uniform.

FIG. 5 is a view for explaining the correction processing performed by the pre-processing unit 1008 according to the first embodiment. In FIG. 5, a signal output from the imaging unit 1004 is input to the pre-processing unit 1008. A radiation image (radiation image data Frxo) of the subject is stored in an image frame memory 502 via a multiplexer 501.

Also, in a similar manner, an offset image Frno (offset signal) is stored in a correction image frame memory 503 via the multiplexer 501. An offset image is used to correct an offset signal which is fixed pattern noise of each pixel arranged in the effective pixel region 401 of the radiation detection unit 450 formed by the light shielded pixels 1050 and the unshielded pixels 1051.

After the offset image has been stored, the dark current correction unit 1081 (dark current correction circuit) performs offset correction. In the offset correction, offset correction processing is performed by, for example, subtracting the offset image Frno from the radiation image (radiation image data Frxo) of the subject.

When binning imaging is performed, the light shielded pixel calculation unit 1060 (light shielded pixel calculation circuit) performs processing to calculate the pixel value of each light shielded pixel in the binning image. Subsequently, as the correction processing of the captured target image, the surface distribution correction unit 1082 (surface distribution correction circuit) corrects the pixel value of each unshielded pixel on the surface of the effective pixel region 401 based on the pixel value of each light shielded pixel in the target image.

The gain correction unit 1083 (gain correction circuit) performs gain correction by using gain correction data Fg stored in a gain correction frame memory 506. The gain correction unit 1083 performs, for example, (Frxo−Frno)/Fg as the gain correction processing. The purpose of gain correction is to correct the sensitivity difference of each pixel in the array substrate 410. Next, the deficiency correction unit 1084 (deficiency correction circuit) performs deficiency correction on the target image. The binning image input to the pre-processing unit 1008 is input to the image processing unit 1009 after undergoing various kinds of correction processing by the dark current correction unit 1081, the surface distribution correction unit 1082, the gain correction unit 1083, and the deficiency correction unit 1084.

Although this embodiment showed an example in which the correction processing by the pre-processing unit 1008 is performed in the information processing unit such as a personal computer (PC) or the like outside the imaging unit 1004, the correction processing function dependent on the arrangement of the array substrate 410 may be implemented as an FPGA mounted on an electrical board in the imaging unit 1004.

Figure 6:
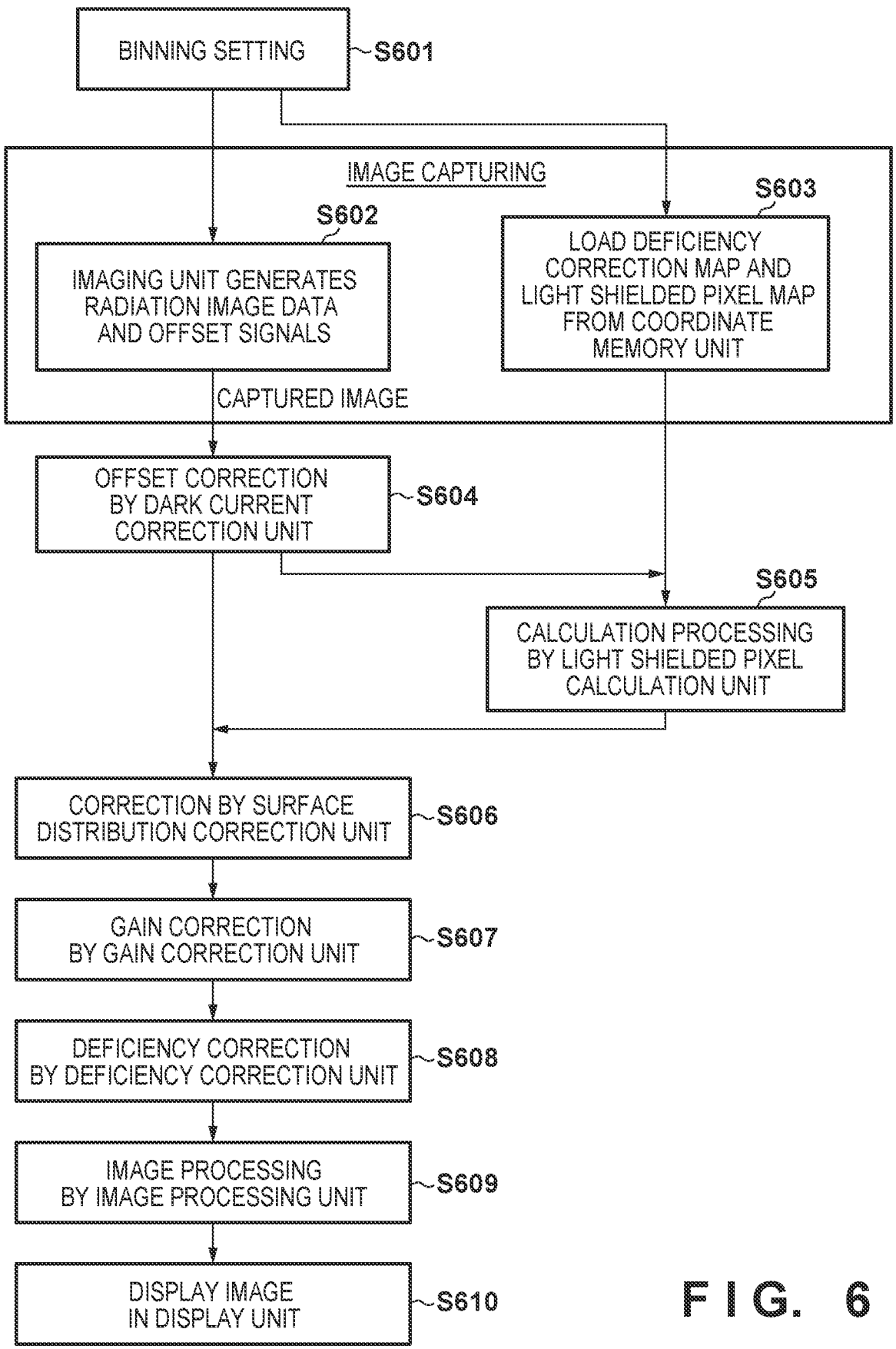
FIG. 6 is a flowchart for explaining the procedure of correction processing according to the first embodiment.

Next, FIG. 6 is a view for explaining the procedure of correction processing according to the first embodiment.

First, in step S601, the imaging setting unit 1040 transmits, under the control of the CPU 1010, the binning setting set via the operation unit 1011 to the imaging unit 1004.

In step S602, the imaging unit 1004 generates radiation image data and offset signals under the control of the signal processing unit 1052. The signal processing unit 1052 included in the imaging unit 1004 controls the gate driver circuit 402, the readout circuit 404, and the signal conversion circuit 405 to perform adding or averaging of pixel values. The imaging unit 1004 outputs the generated radiation image data and offset signals to the dark current correction unit 1081.

In step S603, the CPU 1010 makes an instruction to load each deficiency correction map and each light shielded pixel map stored in the coordinate memory unit 1070. The each deficiency correction map and each light shielded pixel map are loaded to the light shielded pixel calculation unit 1060 under the instruction of the CPU 1010.

In step S604, the dark current correction unit 1081 performs offset correction as the correction processing of the captured target image.

The CPU 1010 determines whether binning imaging is being performed. If it is determined that the binning imaging is not being performed, the process advances to step S606. On the other hand, if the binning imaging is being performed, the CPU 1010 advances the process to step S605.

In step S605, the light shielded pixel calculation unit 1060 performs processing to calculate the pixel value of each light shielded pixel in the binning image, and the process advances to step S606.

In step S606, the surface distribution correction unit 1082 corrects the pixel values of the plurality of pixels in accordance with the number of the light shielded pixels in the target image. If the light shielded pixels 1050 are included in the region specified by the binning setting, the surface distribution correction unit 1082 corrects (OB correction) the pixel value of each light shielded pixel 1050 so that the pixel values of the light shielded pixel 1050 will be uniform on the surface. Subsequently, the surface distribution correction unit 1082 corrects the pixel values of the unshielded pixels 1051 based on the correction result of the pixel values of the light shielded pixels 1050. After correcting the pixel values of the unshielded pixels 1051 based on the pixel values of the light shielded pixel 1050 after the OB correction, the surface distribution correction unit 1082 advances the process to step S607.

In step S607, the gain correction unit 1083 performs gain correction on the target image. After gain correction has been performed by the gain correction unit 1083, the deficiency correction unit 1084 performs, in step S608, deficiency correction on the target image based on each deficiency map loaded from the coordinate memory unit 1070.

In step S609, the image processing unit 1009 executes display image processing on the image that has undergone various kinds of correction processing by the pre-processing unit 1008. Ultimately, the image obtained after the image processing performed by the image processing unit 1009 will be the diagnostic image.

In step S610, the CPU 1010 performs display control to cause the display unit 1012 to display the image after the image processing.

Figure 7A:
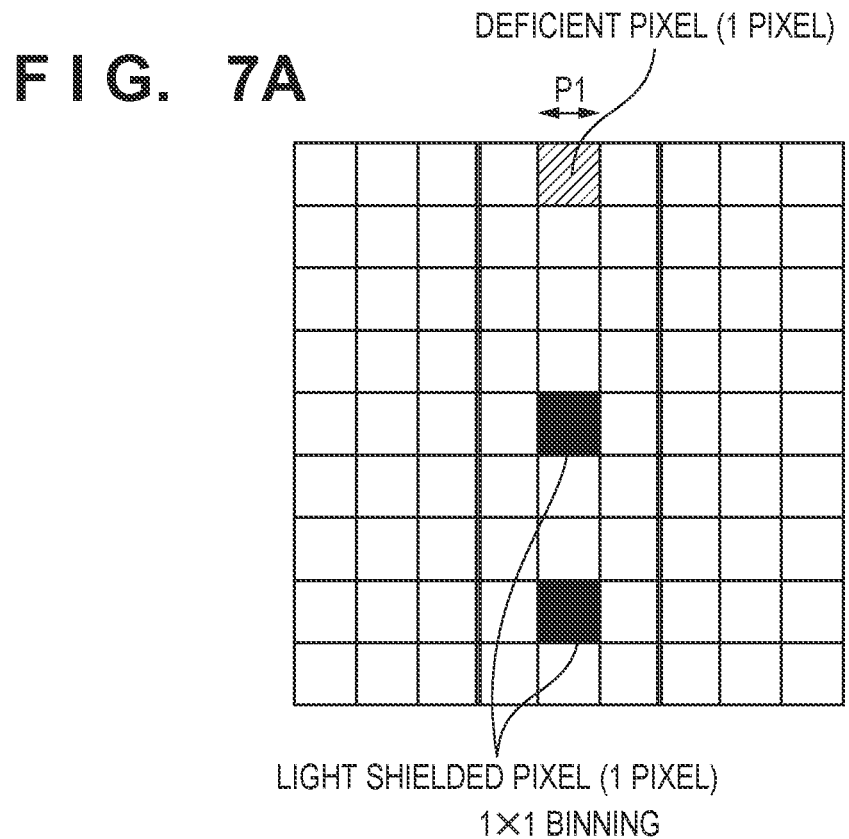
FIGS. 7A and 7B are views showing an example of an array substrate 410 according to the first embodiment.
Figure 7B:
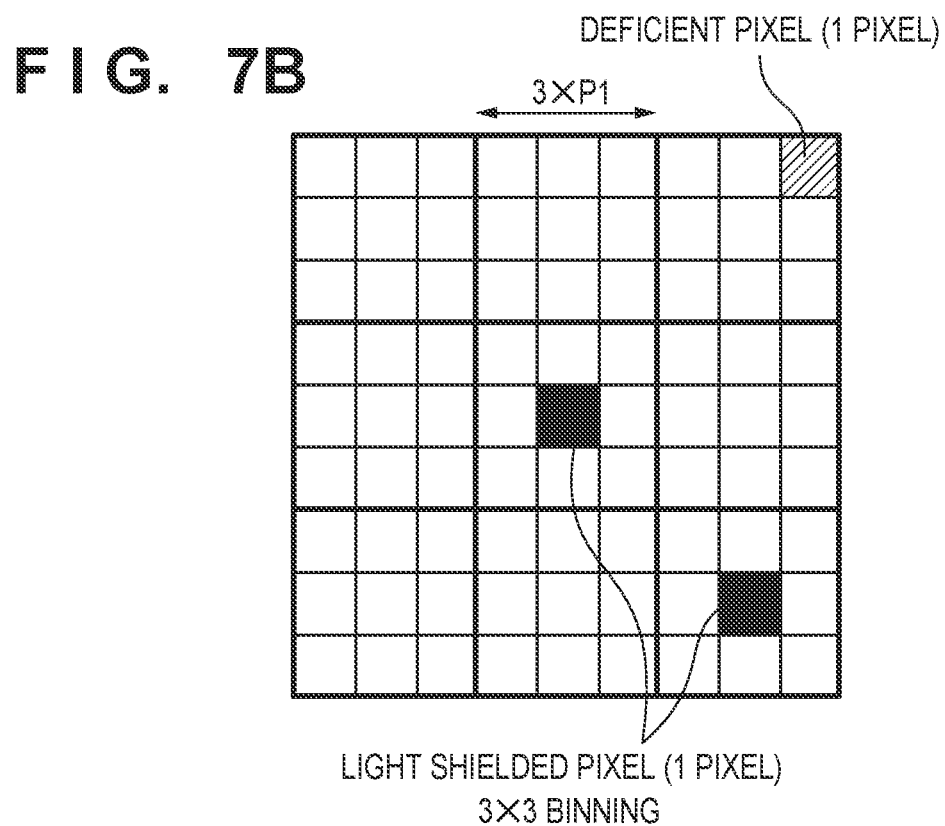

FIGS. 7A and 7B are views showing an example of the array substrate 410 according to the first embodiment. FIG. 7A is a view showing an example of 1×1 binning, and FIG. 7B is a view showing an example of 3×'binning. In FIGS. 7A and 7B, P1 denotes the size of each pixel, and pixels at a pitch of 3×P1 are processed as a single pixel in the 3×'binning. Each light shielded pixel is arranged to correct the surface distribution of dark current caused by the environmental temperature or the like of the entire surface. The light shielded pixels 1050 are arranged so as not to be adjacent to each other in the radiation detection unit 450.

In a case in which a deficient pixel is included in the binning image, the signal processing unit 1052 does not use the pixel value of the deficient pixel in the calculation processing for obtaining the offset signal of each light shielded pixel. For example, if a deficient pixel is present next to the light shielded pixel 1050 when pixel signal addition processing is performed by the signal processing unit 1052, the signal processing unit 1052 controls the pixel signal addition processing so the output signal from the deficient pixel will not be used. In a case in which the light shielded pixels are to be arranged next to each other, for example, the light shielded pixels may be arranged adjacently in a diagonal direction so that they are spaced apart from each other by a predetermined distance to allow information interpolation to be performed easily. Based on the signal processing performed by the signal processing unit 1052, if the surface distribution correction unit 1082 determines that a deficient pixel is included in the binning image, the pixel value of the deficient pixel is not used in the correction of the offset signal of the light shielded pixel 1050.

The deficiency map memory unit 1071 stores a deficiency map for each binning. Although the deficiency map has been used for image correction, the deficiency map can also be used for correcting the surface distribution of the environmental temperature by using the light shielded pixels.

According to the processing described above, changes to the surface by the dark current due to the temperature or environmental change can be corrected even at the time of binning readout/thinning readout in a radiation image capturing operation. Hence, even in a case in which imaging is to be performed for a long time or if heat is generated by performing imaging during charging in a flat radiation imaging apparatus with a high packing density, it is possible to implement a radiation imaging apparatus that can suppress image incongruity caused by the temperature surface distribution in the imaging unit.

COMPARATIVE EXAMPLE

Two problems occur in a case in which the radiation detection unit of the imaging unit 1004 has a binning readout function of reading out the signals of a plurality of pixels at once. The first problem is the problem that the size of the light shielded pixel 1050 will increase. For example, light shielding elements 420 of 3×3 pixels, that is, a total of 9 pixels can be arranged adjacently to each other in the effective pixel region 401 to use the offset signals (dark current outputs) of the light shielding elements 420 at the time of a 3×'binning readout. Although the pixels are processed as a single pixel in the 3×'binning readout, if 3×3 pixels, that is, a total of 9 pixels are set as the light shielded pixel 1050 and handled as a deficiency, the 9 pixels can become a series of deficiencies. If the light shielded pixel 1050 is arranged to cope with the binning readout in this manner, a state in which a lesion, having a size equal to a pixel size that can be regarded as series of deficiencies, cannot be imaged when a tumor or the peripheral shape of the tumor (for example, a spiculated shape) is to be grasped in a radiation image for medical purposes may occur. Hence, it is preferable to prevent the pixel size of the light shielded pixel from increasing even in a radiation detection unit that performs binning readout.

The second problem is the problem that dedicated wiring lines for the light shielded pixel need to be arranged so as to be compatible with the binning readout. Arranging a dedicated signal line and a dedicated driving line for the light shielded pixel will allow the offset signal (dark current output) of the light shielding element to be used even at the time of the binning readout. However, arranging dedicated wiring lines for the light shielded pixel can complicate the structure and may cause a change in the driving/accumulation time or become a noise source in the pixel. Hence, it is preferable to avoid arranging dedicated wiring lines for the light shielded pixel even in the radiation detection unit that performs binning readout.

According to the first embodiment, it is possible to maintain the uniformity of a radiation image even if a light shielded pixel is present. In addition, the pixel size of the light shielded pixel need not be increased or a dedicated wiring line need not be arranged when imaging is to be performed by executing a binning readout. Hence, it is possible to perform calculation processing for correcting the surface distribution of the dark current by using the signal output from a single light shielded pixel when a binning readout is to be performed.

Second Embodiment

The second embodiment of the present invention will be described next. The difference between the processing according to the second embodiment and the processing according to the first embodiment is that, instead of using the pixel value of the light shielded pixel after the execution of binning imaging, which has been obtained based on a pixel value α of each peripheral binning image not including a light shielded pixel 1050 and a pixel value β of a binning image including the light shielded pixel 1050, an offset signal output from the light shielded pixel that has been obtained in advance is used in the calculation processing by a light shielded pixel calculation unit 1060.

Figure 8:
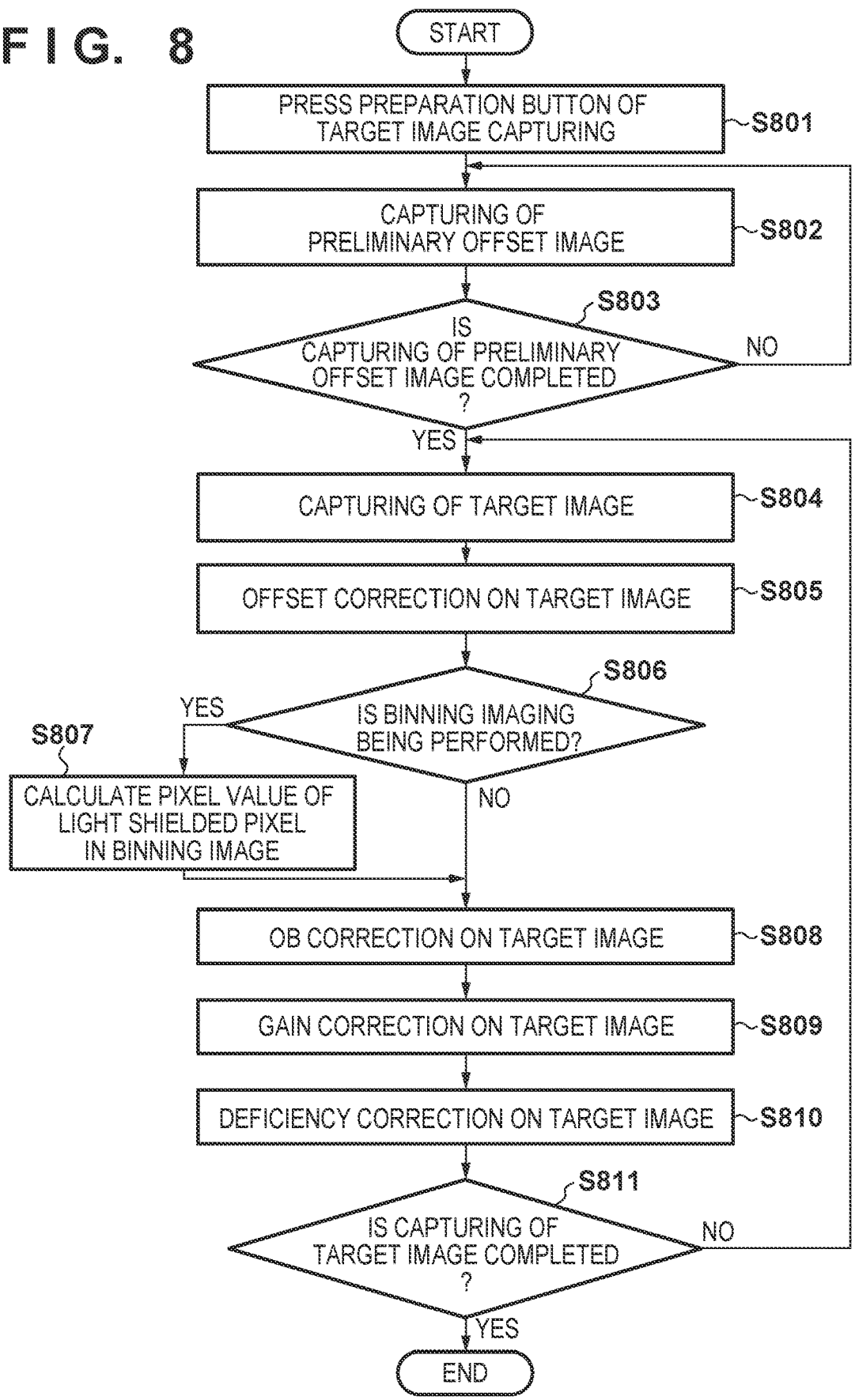
FIG. 8 is a flowchart for explaining the procedure of processing from the start of imaging to the end of imaging according to the second embodiment.

Parts different from the first embodiment will be described hereinafter. FIG. 8 is a flowchart for explaining the procedure of processing from the start to the end of imaging of a subject 1003 by a radiation imaging apparatus 1000 to which the second embodiment can be applied. This processing is executed under the overall control of a CPU 1010 of the radiation imaging apparatus 1000. First, in step S801, an imaging preparation button is pressed in an operation unit 1011.

In step S802, an imaging unit 1004 starts a preparation driving operation, and the imaging unit 1004 of the radiation imaging apparatus 1000 obtains a preliminary offset image (offset signal). Since this preliminary offset image is different from a normal dark current image for image correction and is a dark current image to be used for correcting the surface distribution of a dark current due to environmental temperature, the noise in the image for dark current correction need not be reduced by increasing the number of images to be captured. On the contrary, since an operator may desire the radiation irradiation operation to be executed as soon as possible, a signal processing unit 1052 will, for example, obtain a number of images which are obtainable in a period of few seconds (NO in step S803) or will control the imaging unit 1004 to quickly complete the image obtainment when an irradiation start signal is input.

In step S803, it is determined whether the obtainment of the preliminary offset image has been completed. If the obtainment of the preliminary offset image has been completed (YES in step S803), the process advances to the next step. Note that since it is preferable, from the viewpoint of the imaging unit 1004, to perform the obtainment of an offset image and the obtainment of a radiation image by a simultaneous driving operation, it is possible for the signal processing unit 1052 to control the imaging unit 1004 to continue the image capturing operation by the imaging unit 1004.

In step S804, it becomes possible to perform an image capturing operation for capturing a radiation image (target image) in which the subject 1003 is present, and the image capturing operation of the target image is started by the operation of the operator.

In step S805, a dark current correction unit 1081 performs offset correction as the correction processing on the captured target image. The dark current output value for each pixel is corrected by performing offset correction by using the offset image obtained in advance.

In step S806, the CPU 1010 determines whether binning imaging is performed. If binning imaging is not performed (NO in step S806), the process advances to step S808. On the other hand, if binning imaging is performed (YES in step S806), the CPU 1010 advances the process to step S807.

In step S807, the light shielded pixel calculation unit 1060 obtains the surface distribution of the offset signal based on the offset image obtained before the obtainment of the radiation image, and calculates the pixel value of the light shielded pixel in the binning image. That is, the light shielded pixel calculation unit 1060 obtains the surface distribution of the dark current based on the preliminary offset image obtained in step S802 and calculates the pixel value (dark current signal value) of the light shielded pixel in the target binning image. The light shielded pixel calculation unit 1060 and a surface distribution correction unit 1082 determine, based on the position information of the light shielded pixel, whether the light shielded pixel 1050 is included in the region specified by the binning setting. That is, the light shielded pixel calculation unit 1060 and the surface distribution correction unit 1082 determine, based on the binning setting and the position information of the light shielded pixel 1050 stored in a light shielded pixel map memory unit 1077, whether the light shielded pixel is included in the binning image, and specify the image including the light shielded pixel as the target binning image.

In step S808, the surface distribution correction unit 1082 corrects, in the target image, the surface distribution of the dark current due to environmental temperature or the like by calculation processing based on the preliminary offset image obtained in step S802. That is, the surface distribution correction unit 1082 corrects the pixel values of the plurality of pixels in accordance with the number of light shielded pixels in the target image (region specified by the binning setting in the case of binning imaging). If the light shielded pixel 1050 is included in the region specified by the binning setting, the surface distribution correction unit 1082 corrects the pixel value of the light shielded pixel 1050 so that the pixel value of the light shielded pixel 1050 will be uniform on the surface (OB correction). Subsequently, the surface distribution correction unit 1082 corrects the pixel value of each unshielded pixel 1051 based on the correction result of the pixel value of the light shielded pixel 1050. Upon correcting the pixel value of each unshielded pixel 1051 based on the pixel value of the light shielded pixel 1050 after the OB correction, the surface distribution correction unit 1082 advances the process to step S809.

In step S809, a gain correction unit 1083 performs gain correction on the target image. Subsequently, after the gain correction unit 1083 has performed the gain correction, a deficiency correction unit 1084 performs, in step S810, deficiency correction on the target image.

Next, in step S811, the CPU 1010 determines whether imaging of the target image has been fully completed. If the image capturing operation of the target image has not been fully completed (NO in step S811), the CPU 1010 returns the process to step S804 and controls the operation of the radiation imaging apparatus 1000 so that similar processing will be repetitively executed until image capturing operation of the target image is completed (YES in step S811).

In addition to capturing still images, there is also an increasing demand for moving image capturing in a radiation imaging apparatus. In moving image capturing, since the capacity of an image can be reduced by sacrificing the resolution and allowing the execution of high-speed image capturing, it is advantageous to use a binning readout function that reads out pixels collectively at once. In the binning readout, outputs from a plurality of pixels can be processed as an output from a single pixel by, for example, combining 2×2 pixels, that is, a total of 4 pixels into one pixel or combining 3×3 pixels, that is, a total of 9 pixels into one pixel.

According to the processing described above, it is possible to provide, at the time of binning readout/thinning readout, a radiation imaging apparatus that can suppress incongruity in an image due to the temperature surface distribution in the imaging unit by using at least the pixel value of the light shielded pixel to correct the change on the surface caused by a dark current due to the temperature or environmental change.

Note that the second embodiment is not limited to a method in which the image capturing operation of an offset image is completed before the imaging of a target image as described in FIG. 8. For example, the second embodiment also includes, as a matter of course, a method of calculating the output of each light shielded pixel by calculating, not a radiation image but a radiation image captured before the radiation image, based on the interpolation of peripheral pixels after binning and the output value obtained before gain correction.

Figure 9:
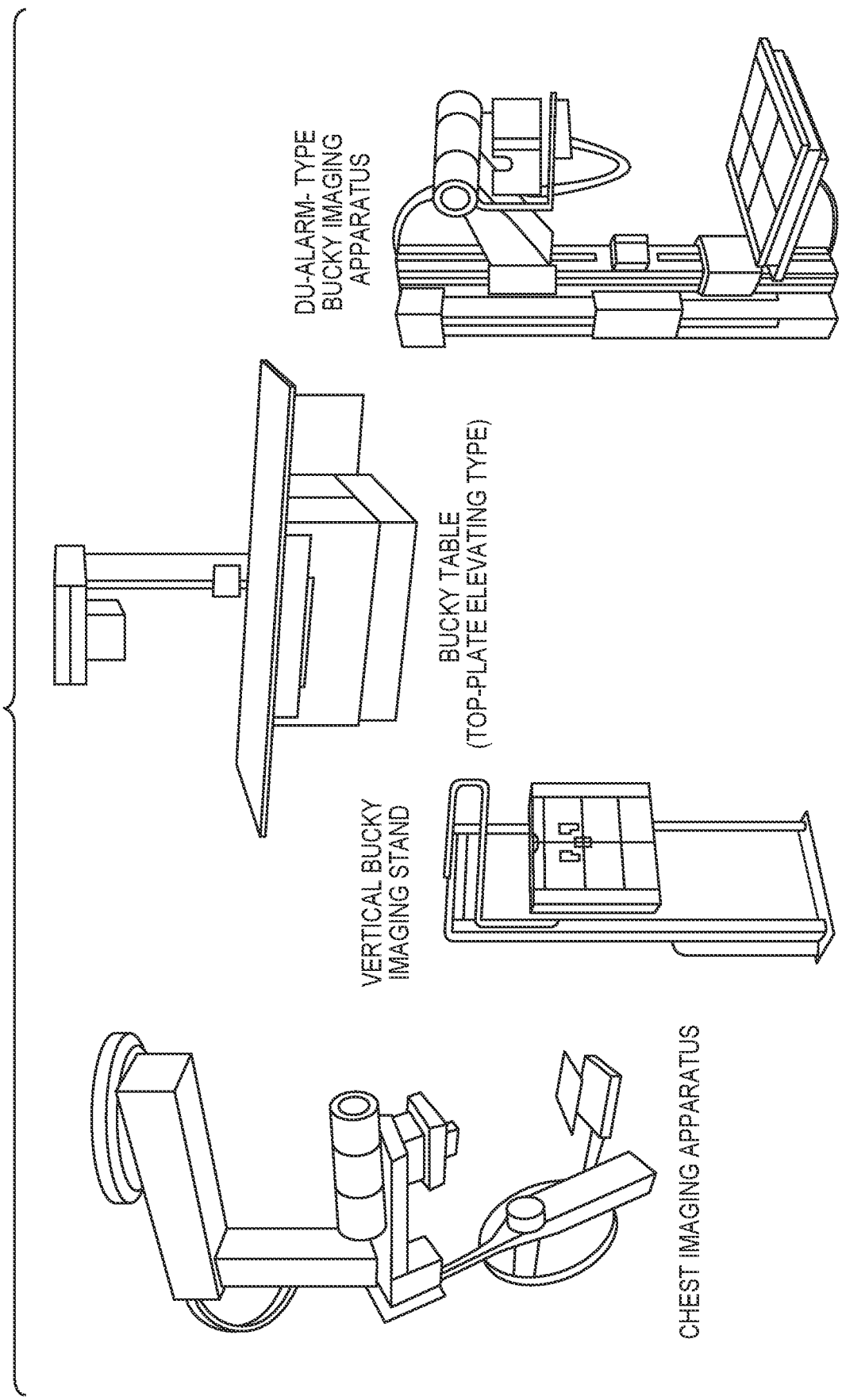
FIG. 9 is a view showing a more specific example of imaging systems to which the radiation imaging apparatus can be applied.

FIG. 9 shows a more specific example of various kinds of imaging systems to which the radiation imaging apparatus 1000 can be attached. The radiation imaging apparatus can be attached to a chest imaging apparatus, a vertical bucky imaging stand, a top-plate elevating type bucky table, or a DU-alarm-type bucky imaging apparatus.

According to the second embodiment of the present invention, the uniformity of a radiation image can be maintained even if light shielded pixels are present. It is not necessary to increase the size of each light shielded pixel or arrange dedicated wiring lines when a binning readout imaging is to be performed, and the calculation processing for correcting the surface distribution of a dark current can be performed by using the signal output from a single light shielded pixel.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-200299, filed Oct. 24, 2018, which is hereby incorporated by reference herein in its entirety.

What is claimed is:

1. A radiation imaging apparatus in which a pixel for obtaining an image based on radiation and a light shielded pixel which is shielded from light are arranged in an array, comprising:
   a setting unit configured to set a region including a plurality of pixels for obtaining the image based on the radiation and cause pixel values based on the plurality of pixels in the region to be output; and
   a correction unit configured to determine whether the light shielded pixel is included in the region, and correct the pixel values based on the plurality of pixels in the region if the light shielded pixel is included in the region.

2. The apparatus according to claim 1, wherein the light shielded pixel is a pixel for obtaining an offset signal included in the image.

3. The apparatus according to claim 1, wherein the setting unit sets a plurality of regions on a surface of a detection unit configured to detect the radiation, and causes the pixel values based on the plurality of pixels to be output for each of the plurality of regions.

4. The apparatus according to claim 3, wherein the correction unit corrects an offset signal of the light shielded pixel so that the radiation will be uniform on the surface of the detection unit configured to detect the radiation.

5. The apparatus according to claim 3, wherein in the detection unit, the light shielded pixels are arranged so as not to be adjacent to each other.

6. The apparatus according to claim 1, wherein if the light shielded pixel is included in the region, the correction unit corrects the pixel values based on the plurality of pixels in accordance with the number of the light shielded pixels in the region.

7. The apparatus according to claim 1, wherein if the light shielded pixel is included in the region, the correction unit amplifies the pixel values based on the plurality of pixels in accordance with the number of light shielded pixels and the plurality of pixels in the region.

8. The apparatus according to claim 1, wherein based on an offset signal of the light shielded pixel, the correction unit corrects the pixel values based on the plurality of pixels.

9. The apparatus according to claim 1, wherein when binning imaging for setting the plurality of pixels as an aggregate and outputting a pixel signal of the aggregate is set, the setting unit sets the region including the plurality of pixels for obtaining the image based on the radiation, causes the pixel values based on the plurality of pixels in the region to be output, and generates a binning image.

10. The apparatus according to claim 1, wherein the correction unit determines based on position information of the light shielded pixel whether the light shielded pixel is included in the region.

11. The apparatus according to claim 1, wherein in a binning size of the set region, the correction unit corrects, based on the pixel values of each peripheral binning image which does not include the light shielded pixel and pixel values of a binning image which includes the light shielded pixel, an offset signal of the light shielded pixel obtained after binning imaging.

12. The apparatus according to claim 11, wherein in a case in which a deficient pixel is included in the binning image, the correction unit does not use a pixel value of the deficient pixel in the correction of the offset signal of the light shielded pixel.

13. A radiation imaging method of a radiation imaging apparatus in which a pixel for obtaining an image based on radiation and a light shielded pixel which is shielded from light are arranged in an array, the method comprising:
   setting a region including a plurality of pixels for obtaining the image based on the radiation and causing pixel values based on the plurality of pixels in the region to be output; and
   determining whether the light shielded pixel is included in the region, and correcting the pixel values based on the plurality of pixels in the region if the light shielded pixel is included in the region.

14. The method according to claim 13, wherein in the setting, a plurality of regions are set on a surface of a detection unit configured to detect the radiation, and the pixel values based on the plurality of pixels are output for each of the plurality of regions.

15. The method according to claim 13, wherein in the correcting, if the light shielded pixel is included in the region, the pixel values based on the plurality of pixels are corrected in accordance with the number of the light shielded pixels in the region.

16. The method according to claim 13, wherein in the correcting, if the light shielded pixel is included in the region, the pixel values based on the plurality of pixels are amplified in accordance with the number of light shielded pixels and the plurality of pixels in the region.

17. The method according to claim 13, wherein in the correcting, an offset signal of the light shielded pixel is corrected so that the radiation will be uniform on the surface of the detection unit configured to detect the radiation.

18. The method according to claim 13, wherein when binning imaging for setting the plurality of pixels as an aggregate and outputting a pixel signal of the aggregate is set, the region including the plurality of pixels for obtaining the image based on the radiation is set, the pixel values based on the plurality of pixels in the region are output, and a binning image is generated in the setting.

19. A storage medium storing a program for causing a computer to execute each step of a radiation imaging method defined in claim 13.

* * * * *